United States Patent
Liu et al.

(10) Patent No.: US 12,020,925 B2
(45) Date of Patent: Jun. 25, 2024

(54) METHODS FOR PREPARING AlN BASED TEMPLATE HAVING Si SUBSTRATE AND GaN BASED EPITAXIAL STRUCTURE HAVING Si SUBSTRATE

(71) Applicant: Xidian University, Xi'an (CN)

(72) Inventors: Zhihong Liu, Xi'an (CN); Junwei Liu, Xi'an (CN); Jincheng Zhang, Xi'an (CN); Lu Hao, Xi'an (CN); Kunlu Song, Xi'an (CN); Hong Zhou, Xi'an (CN); Shenglei Zhao, Xi'an (CN); Yachao Zhang, Xi'an (CN); Weihang Zhang, Xi'an (CN); Yue Hao, Xi'an (CN)

(73) Assignee: Xidian University, Xi'an (CN)

( * ) Notice: Subject to any disclaimer, the term of this patent is extended or adjusted under 35 U.S.C. 154(b) by 474 days.

(21) Appl. No.: 17/275,774

(22) PCT Filed: Feb. 8, 2021

(86) PCT No.: PCT/CN2021/075952
§ 371 (c)(1),
(2) Date: Mar. 12, 2021

(87) PCT Pub. No.: WO2021/218281
PCT Pub. Date: Nov. 4, 2021

(65) Prior Publication Data
US 2022/0108885 A1    Apr. 7, 2022

(30) Foreign Application Priority Data
Apr. 30, 2020    (CN) .......................... 202010361191.X

(51) Int. Cl.
*H01L 21/00*    (2006.01)
*H01L 21/02*    (2006.01)

(52) U.S. Cl.
CPC .. *H01L 21/02458* (2013.01); *H01L 21/02271* (2013.01); *H01L 21/02381* (2013.01); *H01L 21/0254* (2013.01)

(58) Field of Classification Search
CPC ........... H01L 21/0254; H01L 21/02381; H01L 21/02458
See application file for complete search history.

(56) References Cited

U.S. PATENT DOCUMENTS

2016/0071958 A1*  3/2016  Liu ..................... H01L 21/0254
                                                                    438/285
2018/0122928 A1    5/2018  Roberts et al.

FOREIGN PATENT DOCUMENTS

CN         106847672 A  *  6/2017
CN         108428619 A  *  8/2018  ......... H01L 21/0254

OTHER PUBLICATIONS

Physica Status Solidi (A) Applications and Materials, RF loss mechanisms in GaN-based high-electron-mobility-transistor on silicon: Role of an inversion channel at the AlN/Si interface, Tien Tung. Luong et al.

(Continued)

*Primary Examiner* — Reema Patel

(57) ABSTRACT

A method for preparing an AlN based template having a Si substrate and a method for preparing a GaN based epitaxial structure having a Si substrate are provided. The method for preparing the AlN based template having the Si substrate, which includes: providing the Si substrate; growing an AlN nucleation layer on the Si substrate; and introducing an ion passing through the AlN nucleation layer and into the Si substrate. After the AlN nucleation layer is prepared on the Si substrate, the ions are introduced into the Si substrate and the AlN nucleation layer through the AlN nucleation layer. In this way, types of the introduced ions can be expanded. In addition, a carrier concentration at an interface between the (Continued)

Si substrate and the AlN nucleation layer and a carrier concentration in the AlN nucleation layer can also be reduced.

12 Claims, 3 Drawing Sheets

(56) References Cited

OTHER PUBLICATIONS

Proceedings of the 9th European Microwave Integrated Circuits Conference, Improving GaN on Si Power Amplifiers through reduction of parasitic conduction layer, Lyndon Pattison et al.

* cited by examiner

METHODS FOR PREPARING AlN BASED TEMPLATE HAVING Si SUBSTRATE AND GaN BASED EPITAXIAL STRUCTURE HAVING Si SUBSTRATE

TECHNICAL FIELD

The disclosure relates to the technical field of semiconductors, and in particular to a method for preparing an aluminum nitride (AlN) based template having a silicon (Si) substrate and a method for preparing a gallium nitride (GaN) based epitaxial structure having a Si substrate.

DESCRIPTION OF RELATED ART

Gallium nitride (GaN), as a third-generation semiconductor material, has advantages of a wide band gap, a high critical breakdown field strength, a high electron mobility and a high saturated electron drift speed. Further, the GaN has great development potential in the field of microwave or millimeter-wave high-power electronic devices and can be widely used in several fields such as aerospace, radar, 5G communication and so on. A GaN based epitaxial wafer includes two types of homoepitaxy and heteroepitaxy. Because the cost of GaN homoepitaxy is very high, the heteroepitaxy is commonly used. A commonly used substrate for the GaN heteroepitaxy may be a sapphire substrate, a silicon carbide (SiC) substrate or a silicon (Si) substrate, among which the Si substrate has the advantages of a larger size, a lower cost and a compatibility with Si-based CMOS (complementary metal oxide semiconductor) process. At present, the research of a GaN based epitaxial wafer based on a Si substrate is one of the international hot spots.

At present, a typical GaN based epitaxial wafer based on a Si substrate includes an AlN nucleation layer, a graded AlGaN transition layer or an AlN/GaN superlattice transition layer, a GaN buffer layer and a group III nitride heterostructure for devices. In an epitaxial growth process, Al atoms and Ga atoms in the AlN nucleation layer and a group III nitride transition layer in the GaN based epitaxial wafer based on the Si substrate will diffuse to the Si substrate, forming p-type doping on the Si substrate, thereby resulting in a p-type conductive channel on the surface of the Si substrate. In addition, due to the existence of polarized charge in the AlN nucleation layer, there is an n-type inversion conduction channel at an interface between the Si substrate and the AlN nucleation layer. High defect density in the AlN nucleation layer will also result in a high background carrier concentration. These factors bring high electromagnetic loss to the GaN based epitaxial wafer based on the Si substrate and microwave devices fabricated on the GaN based epitaxial wafer based on the Si substrate, which reduces the characteristics of the GaN microwave devices. Therefore, in order to improve the characteristics of the GaN microwave devices and meet application requirements of the GaN microwave devices in several fields such as aerospace, radar, 5G communication and so on, it is necessary to reduce a radio frequency loss of the GaN based epitaxial wafer based on the Si substrate.

At present, main measures reported in the literature to reduce the radio frequency loss of the GaN based epitaxial wafer on the Si substrate are as follows. One method is optimizing a thickness and growth conditions of the AlN nucleation layer, and using a relatively thin AlN nucleation layer (referring to an article titled "RF loss mechanisms in GaN-based high-electron-mobility-transistor on silicon: Role of an inversion channel at the AlN/Si interface" issued by Tien Tung. Luong et al., in Physica Status Solidi (A) Applications and Materials, on April 2017). However, the thin AlN nucleation layer will affect quality of the group III nitride transition layer, the GaN buffer layer and the group III nitride heterostructure for devices. In addition, the p-type doped channel on the surface of the Si substrate and the n-type inversion channel at the interface between the Si substrate and the AlN nucleation layer still exist, and the problem has not been solved. The other method is removing the Si substrate under a radio frequency device by removing the substrate locally (referring to an article titled "Improving GaN on Si Power Amplifiers through reduction of parasitic conduction layer" issued by Lyndon. Pattison et al., in Proceedings of the 9th European Microwave Integrated Circuits Conference). However, the local removal of the Si substrate will introduce a relatively large thermal resistance, which will affect a heat dissipation of the device. In addition, it will bring difficulties to the fabrication of a via hole and a back metal of of the substrate of the radio frequency device.

In addition, some foreign patents put forward that after the growth of the AlN nucleation layer and the AlGaN transition layer on the Si substrate is completed, an element ion with a relative atomic mass lower than 5 such as a H ion is introduced at the interface between the Si substrate and the AlN nucleation layer using an ion implantation technology, so as to destroy a lattice structure of the Si substrate and prevent the diffusion of Al and Ga atoms to Si substrate, thereby reducing a carrier concentration at the interface between the Si substrate and the AlN nucleation layer and reducing the radio frequency loss of the GaN based epitaxial wafer based on the Si substrate (referring to a patent application publication No.: US 2018/0122928 A1, titled "III-Nitride semiconductor structures comprising spatially patterned introduced species" issued by J. C. Roberts, et al.). However, this patent does not propose to deal with the background carrier concentration in III-nitride materials, and the background carrier concentration in the III-nitride materials is also an important factor effecting the electromagnetic loss of the GaN devices on Si substrates. In addition, when ion implantation is carried out after the epitaxial growth of the AlGaN transition layer, if the relative atomic mass of the introduced ion is greater than 5, the implantation depth of the ion is limited, and thus the introduced ion cannot be introduced at the interface between the Si substrate and the AlN nucleation layer, so it is necessary to limit the introduced ion to a element with a relative atomic mass less than 5, which reduces the number and selection of introduced ions. Further, since the ion is introduced after the epitaxial growth of the AlGaN transition layer, and impurity ion will be adsorbed on the surface of the AlGaN transition layer, the impurity ion will diffuse into the GaN buffer layer and the group III nitride heterostructure, when the epitaxial growth of the GaN buffer layer and the group III nitride heterostructure is proceeded, thereby affecting the performance of the device.

SUMMARY

In order to solve technical problems in the prior art, the disclosure provides a method for preparing an AlN based template having a Si substrate and a method for preparing a GaN based epitaxial structure having a Si substrate. The technical problems to be solved by the disclosure are realized by the following technical solutions.

An embodiment of the disclosure provides a method for preparing an AlN based template having a Si substrate, which includes: providing the Si substrate; growing an AlN nucleation layer on the Si substrate; and introducing an ion passing through the AlN nucleation layer and into the Si substrate.

In an embodiment of the disclosure, growing an AlN nucleation layer on the Si substrate includes: growing the AlN nucleation layer on the Si substrate using one of a molecular beam epitaxy (MBE) method, a metal-organic chemical vapor deposition (MOCVD) method, a hydride vapor phase epitaxy (HYPE) method and a physical vapor deposition (PVD) method.

In an embodiment of the disclosure, the method further includes: introducing another ion into the AlN nucleation layer, before or after introducing the ion passing through the AlN nucleation layer and into the Si substrate.

In an embodiment of the disclosure, introducing an ion passing through the AlN nucleation layer and into the Si substrate, and introducing another ion into the AlN nucleation layer, respectively include: introducing the ion passing through the AlN nucleation layer and into the Si substrate using an ion implantation method, and introducing the another ion into the AlN nucleation layer using an ion implantation method.

In an embodiment of the disclosure, a dose of ion for introducing the ion passing through the AlN nucleation layer and into the Si substrate in a range from $1 \times 10^{10}$ cm$^{-2}$ to $1 \times 10^{16}$ cm$^{-2}$, and an energy of ion for introducing the ion passing through the AlN nucleation layer and into the Si substrate is in a range from 10 KeV to 100 KeV.

In an embodiment of the disclosure, the ion introduced into the Si substrate includes one or more ions selected from the group consisting of argon (Ar), nitrogen (N), hydrogen (H), oxygen (O), fluorine (F), arsenic (As) and phosphorus (P); and the ion introduced into the AlN nucleation layer includes one or more ions selected from the group consisting of Ar, N, iron (Fe), carbon (C), F and magnesium (Mg).

In an embodiment of the disclosure, a resistivity of the Si substrate is in a range from 0.01 Ω·cm to 10000 Ω·cm.

In an embodiment of the disclosure, a thickness of the Si substrate is in a range from 100 micrometers (μm) to 1500 μm.

In an embodiment of the disclosure, a thickness of the AlN nucleation layer is in a range from 10 nanometers (nm) to 500 nm.

An embodiment of the disclosure provides a method for preparing a GaN based epitaxial structure having a Si substrate, which includes: preparing an AlN based template having a Si substrate; growing a group III nitride transition layer on an AlN nucleation layer of the AlN based template having the Si substrate; growing a GaN buffer layer on the group III nitride transition layer; and growing a group III nitride heterostructure for a radio frequency device on the GaN buffer layer; where preparing an AlN based template having the Si substrate includes: providing the Si substrate; growing an AlN nucleation layer on the Si substrate; and introducing a first ion passing through the AlN nucleation layer and into the Si substrate.

In an embodiment of the disclosure, growing an AlN nucleation layer on the Si substrate includes: growing the AlN nucleation layer on the Si substrate using one of an MBE method, an MOCVD method, an HYPE method and a PVD method.

In an embodiment of the disclosure, preparing an AlN based template having the Si substrate further includes: introducing a second ion into the AlN nucleation layer, before or after introducing the first iron passing through the AlN nucleation layer and into the Si substrate.

In an embodiment of the disclosure, introducing a first ion passing through the AlN nucleation layer and into the Si substrate, and introducing a second ion into the AlN nucleation layer, respectively includes: introducing the first ion passing through the AlN nucleation layer and into the Si substrate using an ion implantation method, and introducing the second ion into the AlN nucleation layer using an ion implantation method.

In an embodiment of the disclosure, a dose of ion for introducing the first ion is in a range from $1 \times 10^{10}$ cm$^{-2}$ to $1 \times 10^{16}$ cm$^{-2}$, an energy of ion for introducing the first ion is in a range from 10 KeV to 100 KeV.

In an embodiment of the disclosure, the first ion introduced into the Si substrate includes one or more ions selected from the group consisting of Ar, N, H, O, F, As and P; and the first ion introduced into the AlN nucleation layer includes one or more ions selected from the group consisting of Ar, N, Fe, C, F and Mg.

In an embodiment of the disclosure, a resistivity of the Si substrate is in a range from 0.01 Ω·cm to 10000 Ω·cm.

In an embodiment of the disclosure, a thickness of the Si substrate is in a range from 100 μm to 1500 μm.

In an embodiment of the disclosure, a thickness of the AlN nucleation layer is in a range from 10 nm to 500 nm.

The disclosure has following beneficial effects: after the AlN nucleation layer is prepared on the Si substrate, the ions are introduced into the Si substrate and the AlN nucleation layer through the AlN nucleation layer. In this way, types of the introduced ions can be expanded. In addition, a carrier concentration at an interface between the Si substrate and the AlN nucleation layer and a carrier concentration in the AlN nucleation layer can also be reduced, thereby a radio frequency loss of the AlN based template having the Si substrate is reduced and performance of GaN microwave devices manufactured by using the AlN based template having the Si substrate is improved, so as to meet application requirements of the GaN microwave devices in several fields such as aerospace, radar, 5G communication and so on. Further, since the GaN buffer layer is prepared on the AlN based template having the Si substrate, the designed GaN based epitaxial wafer have more freedom.

The disclosure will be further described in detail with reference to the drawings and detailed description.

DETAILED DESCRIPTION OF EMBODIMENTS

The disclosure will be described in further detail with specific examples below, but the embodiments of the disclosure are not limited thereto.

First Embodiment

Figure 1:
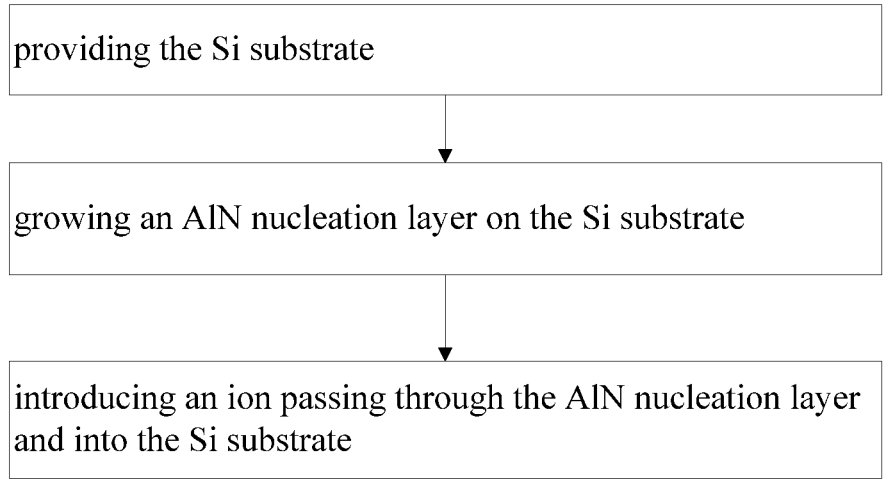
FIG. 1 is a schematic flow chart of a method for preparing an AlN based template having a Si substrate according to an embodiment of the disclosure.
Figure 2A:
FIGS. 2a to 2c are schematic process diagrams of a method for preparing an AlN based template having a Si substrate according to an embodiment of the disclosure.
Figure 2B:
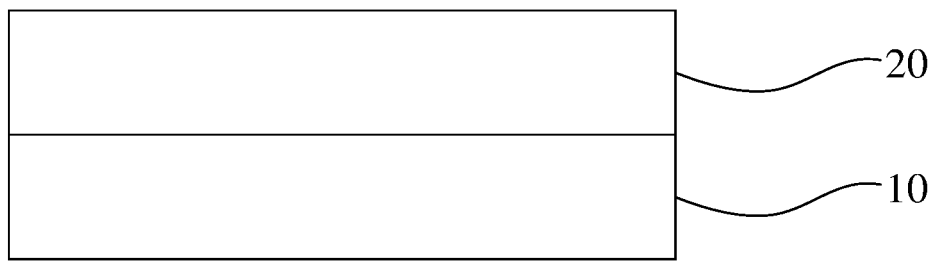
Figure 2C:
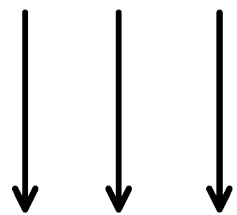
Figure 2C:
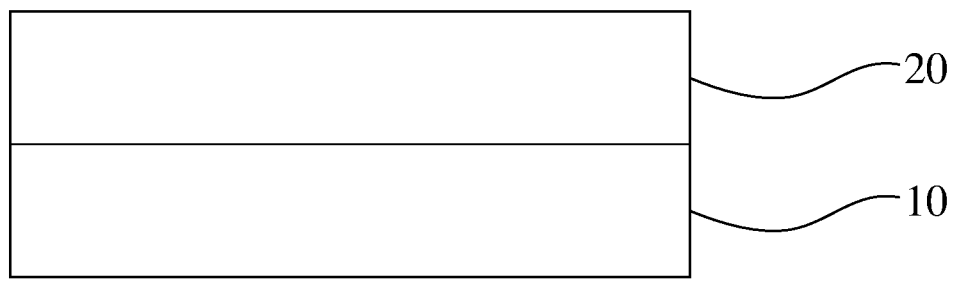

Referring to FIGS. 1, and 2a to 2c, FIG. 1 is a schematic flow chart of a method for preparing an aluminum nitride (AlN) template on a silicon (Si) substrate according to an embodiment of the disclosure; and FIGS. 2a to 2c are schematic process diagrams of a method for preparing an AlN based template having a Si substrate according to an embodiment of the disclosure. In the embodiment, a method for preparing an AlN based template having a Si substrate is provided, which includes steps 1 to 3.

In step 1, as shown in FIG. 2a, a Si substrate 10 is provided.

Optionally, a resistivity of the Si substrate 10 is in a range from 0.01 Ω·cm to 10000 Ω·cm.

Optionally, a crystal orientation of the Si substrate 10 is 111.

Optionally, a thickness of the Si substrate 10 is in a range from 100 μm to 1500 μm. With this thickness, a heat dissipation effect is ensured, due to: when the thickness of the Si substrate 10 is too thin, not only the performance thereof cannot be improved, but also reliability problems are brought; further, when the thickness of the Si substrate 10 is too thick, not only the cost is increased, but also heat dissipation problems are brought because of a low thermal conductivity of Si.

In step 2, as shown in FIG. 2b, an AlN nucleation layer 20 is grown on the Si substrate 10.

Specifically, the AlN nucleation layer 20 is grown on the Si substrate 10 using one of a molecular beam epitaxy (MBE) method, a metal-organic chemical vapor deposition (MOCVD) method, a hydride vapor phase epitaxy (HYPE) method and a physical vapor deposition (PVD) method. The Si substrate 10 and the AlN nucleation layer 20 constitute the AlN based template having the Si substrate.

Optionally, a thickness of the AlN nucleation layer is in a range from 10 nm to 500 nm.

In step 3, as shown in FIG. 2c, an ion is introduced passing through the AlN nucleation layer 20 and into the Si substrate 10.

Specifically, the ion is introduced passing through the AlN nucleation layer 20 and into the Si substrate 10 using an ion implantation method.

Optionally, the ion introduced into the Si substrate 10 includes one or more of ions selected from the group consisting of argon (Ar), nitrogen (N), hydrogen (H), oxygen (O), fluorine (F), arsenic (As) and phosphorus (P). When at least two ions are introduced, the ions can be introduced into the Si substrate 10 at the same time, and also can be introduced in batches, preferably the ions are introduced in batches.

In addition, in the embodiment, in order to further reduce a radio frequency loss of the AlN based template having the Si substrate, another ion may also be introduced into the AlN nucleation layer, which may be performed before or after introducing the ion passing through the AlN nucleation layer 20 and into the Si substrate 10, which is not specifically limited in the embodiment.

Further, an ion is introduced into the AlN nucleation layer 20 using the ion implantation method.

Optionally, the ion introduced into the AlN nucleation layer 20 includes one or more ions selected from the group consisting of Ar, N, iron (Fe), carbon (C), F and magnesium (Mg). When at least two ions are introduced, the ions can be introduced into the AlN nucleation layer 20 at the same time (i.e., simultaneously), and also can be introduced in batches (i.e., one after another), preferably the ions are introduced in batches.

As such, a carrier concentration at an interface between the Si substrate and the AlN nucleation layer and a carrier concentration in the AlN nucleation layer can be reduced, and the technical effect of reducing a radio frequency loss of the AlN based template having the Si substrate can be achieved, so that radio frequency performance of GaN microwave devices can be improved, so as to meet application requirements of the GaN microwave devices in several fields such as aerospace, radar, 5G communication and so on. In the disclosure, after the AlN nucleation layer is deposited on the Si substrate, the ion is introduced, so that types of the introduced ions can be expanded, and not only an element with a relative atomic mass less than 5 can be selected, but also an element with a larger relative atomic mass such as Ar and N can be selectively introduced. In addition, since the GaN buffer layer is prepared on the AlN based template having the Si substrate, the designed GaN based epitaxial wafer have more freedom.

Further, a dose of ion for introducing the ion passing through the AlN nucleation layer and into the Si substrate is in a range from $1\times10^{10}$ cm$^{-2}$ to $1\times10^{16}$ cm$^{-2}$, an energy of ion for introducing the ion passing through the AlN nucleation layer and into the Si substrate is in a range from 10 KeV to 100 KeV. With this dose and the energy, the introduced ion is ensured to be capable of entering the Si substrate, destroying the crystal structure of Si, reducing the carrier concentration at the AlN/Si interface, and thus a radio frequency loss of the AlN based template having the Si substrate is reduced.

In the disclosure, after the AlN nucleation layer is prepared on the Si substrate, the ions are introduced into the Si substrate and the AlN nucleation layer through the AlN nucleation layer. In this way, types of the introduced ions can be expanded. In addition, a carrier concentration at an interface between the Si substrate and the AlN nucleation layer and a carrier concentration in the AlN nucleation layer can also be reduced, thereby a radio frequency loss of the AlN based template having the Si substrate is reduced and performance of GaN microwave devices manufactured by using the AlN based template having the Si substrate is improved, so as to meet application requirements of the GaN microwave devices in several fields such as aerospace, radar, 5G communication and so on. Further, since the GaN buffer layer is prepared on the AlN based template having the Si substrate, the designed GaN based epitaxial wafer have more freedom.

Second Embodiment

On the basis of the first embodiment, the disclosure provides a specific method for preparing an AlN based template having a Si substrate, which includes steps 1 to 3.

In step 1, as shown in FIG. 2a, a Si substrate 10 is provided.

Specifically, a thickness of the Si substrate 10 is 675 μm, a resistivity of the Si substrate 10 is 5000 Ω·cm, and a crystal orientation of the Si substrate 10 is 111.

In step 2, as shown in FIG. 2b, an AlN nucleation layer 20 is grown on the Si substrate 10.

Specifically, the AlN nucleation layer 20 having a thickness of 200 nm is grown on the Si substrate 10 using the MOCVD method.

In step 3, as shown in FIG. 2c, an ion is introduced passing through the AlN nucleation layer 20 and into the Si substrate 10.

Specifically, the ion is introduced into the Si substrate 10 on which the AlN nucleation layer 20 is deposited, the ion is Ar, a dose of the ion is $1\times10^{14}$ cm$^{-2}$, an energy of the ion is 10 MeV. As such, the production of the AlN based template having the Si substrate is completed.

Third Embodiment

On the basis of the first embodiment, the disclosure provides another method for preparing an AlN based template having a Si substrate, which includes steps 1 to 4.

In step 1, as shown in FIG. 2a, a Si substrate 10 is provided.

Specifically, a thickness of the Si substrate 10 is 675 μm, a resistivity of the Si substrate 10 is 5000 Ω·cm, and a crystal orientation of the Si substrate 10 is 111.

In step 2, as shown in FIG. 2b, an AlN nucleation layer 20 is grown on the Si substrate 10.

Specifically, the AlN nucleation layer 20 having a thickness of 200 nm is grown on the Si substrate 10 using the MOCVD method.

In step 3, as shown in FIG. 2c, an ion is introduced passing through the AlN nucleation layer 20 and into the Si substrate 10.

Specifically, the ion is introduced into the Si substrate 10 on which the AlN nucleation layer 20 is deposited, the ion is N, a dose of the ion is $1\times10^{15}$ cm$^{-2}$, an energy of the ion is 5 MeV.

In step 4, as shown in FIG. 2c, another ion is introduced into the AlN nucleation layer 20.

Specifically, after the AlN nucleation layer 20 is deposited, the another ion is introduced into the AlN nucleation layer 20, the introduced ion is Fe, a dose of the ion is $1\times10^{14}$ cm$^{-2}$, an energy of the ion is 300 MeV. As such, the production of the AlN based template having the Si substrate is completed.

Fourth Embodiment

On the basis of the first embodiment, the disclosure provides a yet another method for preparing an AlN based template having a Si substrate, which includes steps 1 to 4.

In step 1, as shown in FIG. 2a, a Si substrate 10 is provided.

Specifically, a thickness of the Si substrate 10 is 1150 μm, a resistivity of the Si substrate 10 is 5000 Ω·cm, and a crystal orientation of the Si substrate 10 is 111.

In step 2, as shown in FIG. 2b, an AlN nucleation layer 20 is grown on the Si substrate 10.

Specifically, the AlN nucleation layer 20 having a thickness of 200 nm is grown on the Si substrate 10 using the MBE method.

In step 3, as shown in FIG. 2c, an ion is introduced passing through the AlN nucleation layer 20 and into the Si substrate 10.

Specifically, the ion is introduced into the Si substrate 10 on which the AlN nucleation layer 20 is deposited, the ion is F, a dose of the ion is $1\times10^{16}$ cm$^{-2}$, an energy of the ion is 5 MeV.

In step 4, as shown in FIG. 2c, another ion is introduced into the AlN nucleation layer 20.

Specifically, after the AlN nucleation layer 20 is deposited, the another ion is introduced into the AlN nucleation layer 20, the ion is Ar, a dose of the ion is $1\times10^{14}$ cm$^{-2}$, an energy of the ion is 300 MeV. As such, the production of the AlN based template having the Si substrate is completed.

The second, third and fourth embodiments only express three embodiments of the disclosure, which cannot be understood as limiting the patent scope of the disclosure. It should be pointed out that, for those of ordinary skill in the field, without departing from the concept of the disclosure, several modifications and improvements can be made, which belong to the protection scope of the disclosure.

Fifth Embodiment

On the basis of the above embodiments, the disclosure provides a method for preparing a GaN based epitaxial structure having a Si substrate, which includes steps 1 to 4.

Figure 3A:
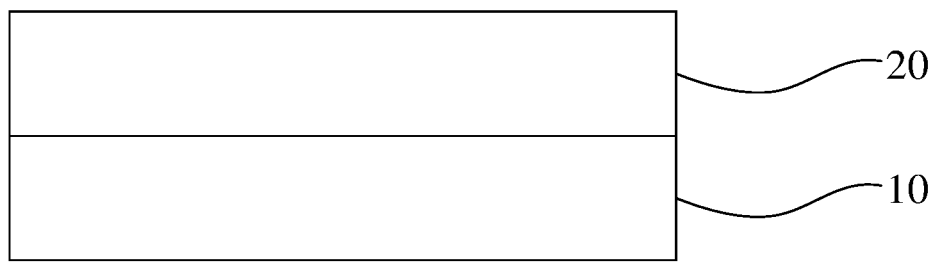
FIGS. 3a to 3d are schematic process diagrams of a method for preparing a GaN based epitaxial structure having a Si substrate according to an embodiment of the disclosure.

In step 1, as shown in FIG. 3a, the AlN based template having the Si substrate is prepared using the method for preparing the AlN based template of the Si substrate in the above embodiment, which sequentially includes a Si substrate 10 and an AlN nucleation layer 20 from bottom to top.

Figure 3B:
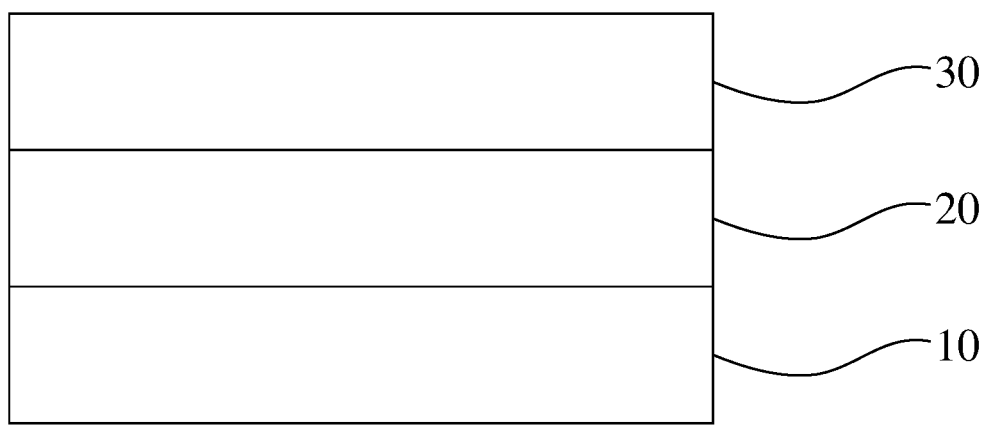

In step 2, as shown in FIG. 3b, a group III nitride transition layer 30 is grown on the AlN nucleation layer 20.

Specifically, the group III nitride transition layer 30 is grown on the AlN nucleation layer 20 using the MOCVD method.

Figure 3C:
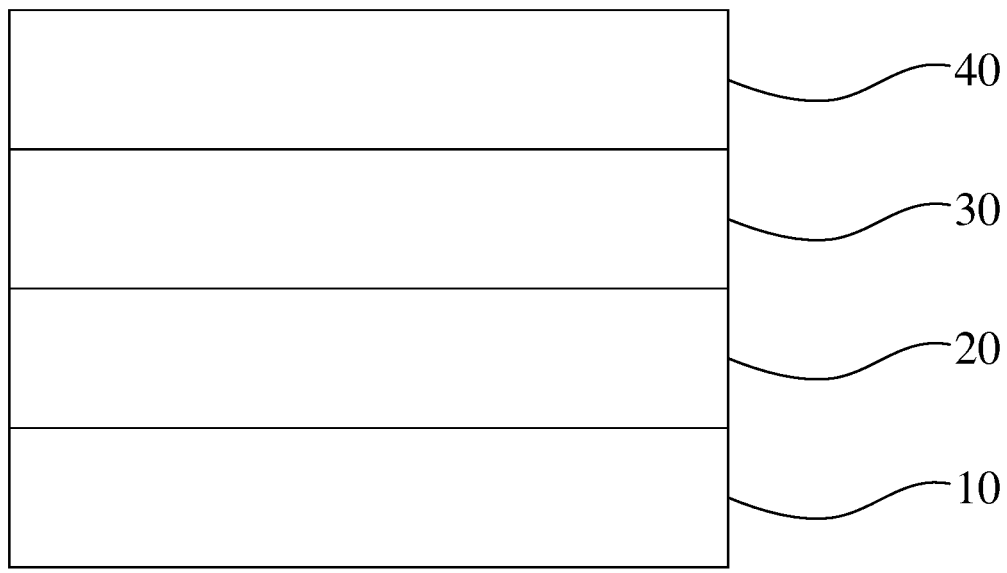

In step 3, as shown in FIG. 3c, a GaN buffer layer 40 is grown on the group III nitride transition layer 30.

Specifically, the GaN buffer layer 40 is grown on the group III nitride transition layer 30 using the MOCVD method.

Figure 3D:
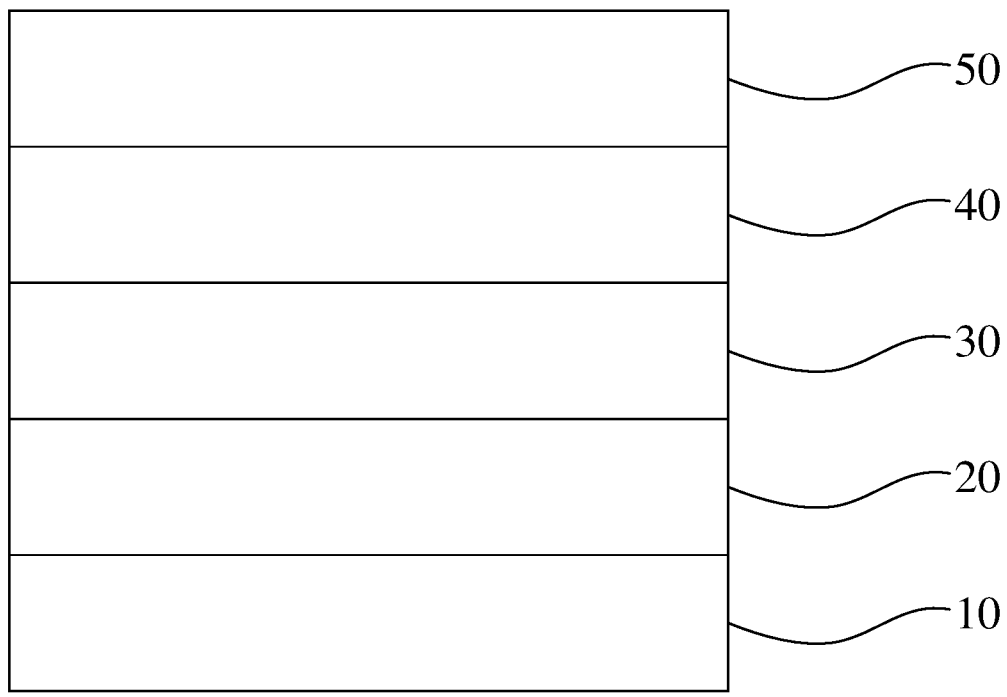

In step 4, as shown in FIG. 3d, a group III nitride heterostructure 50 for a radio frequency device is grown on the GaN buffer layer 40.

Specifically, the group III nitride heterostructure 50 for the radio frequency device is grown on the GaN buffer layer 40 using the MOCVD method.

In addition, after the GaN buffer layer 40 is grown on the AlGaN transition layer 30, an AlN interlayer may be grown on the GaN buffer layer 40 first, and then an AlGaN barrier layer 50 may be grown on the AlN interlayer, for example, by the MOCVD method.

In the disclosure, after the AlN nucleation layer is prepared on the Si substrate, the ions are introduced passing through the AlN nucleation layer and into the Si substrate and into the AlN nucleation layer. In this way, types of the introduced ions can be expanded. In addition, a carrier concentration at an interface between the Si substrate and the AlN nucleation layer and a carrier concentration in the AlN nucleation layer can also be reduced, thereby a radio frequency loss of the AlN based template having the Si substrate is reduced and performance of GaN microwave devices manufactured by using the AlN based template having the Si substrate is improved, so as to meet application requirements of the GaN microwave devices in several fields such as aerospace, radar, 5G communication and so on. Further, since the GaN buffer layer is prepared on the AlN based template having the Si substrate, the designed GaN based epitaxial wafer have more freedom.

In the description of the disclosure, terms "first" and "second" are only used for descriptive purposes, and cannot be understood as indicating or implying relative importance or implicitly indicating the number of indicated technical features. Therefore, the features defined with the terms "first" and "second" may include one or more of the features explicitly or implicitly. In the description of the disclosure, a term "multiple" means two or more, unless otherwise specifically defined.

In the description of this specification, descriptions referring to the terms "one embodiment", "some embodiments", "examples", "specific examples" or "some examples" mean that specific features, structures, materials or special data points described in connection with this embodiment or example are included in at least one embodiment or example of the disclosure. In this specification, the schematic expressions of the above terms do not necessarily refer to the same embodiments or examples. Furthermore, the specific features, structures, materials or special data points described may be combined in any one or more embodiments or examples in a suitable manner. In addition, those skilled in the art can join and combine different embodiments or examples described in this specification.

The above is a further detailed description of the disclosure combined with specific preferred embodiments, and it cannot be considered that the specific implementations of the disclosure are limited to these descriptions. For ordinary technicians in the technical field to which the disclosure belongs, several simple deductions or substitutions can be made without departing from the concept of the disclosure, which should be regarded as belonging to the protection scope of the disclosure.

What is claimed is:

1. A method for preparing an aluminum nitride (AlN) based template having a silicon (Si) substrate, comprising:
   providing the Si substrate;
   growing an AlN nucleation layer on the Si substrate;
   introducing an ion passing through the AlN nucleation layer and into the Si substrate; and
   introducing another ion into the AlN nucleation layer, before or after introducing the ion passing through the AlN nucleation layer and into the Si substrate;
   wherein a resistivity of the Si substrate is in a range from 0.01 $\Omega \cdot cm$ to 10000 $\Omega \cdot cm$, a thickness of the Si substrate is in a range from 100 micrometers ($\mu m$) to 1500 $\mu m$, and a thickness of the AlN nucleation layer is in a range from 10 nanometers (nm) to 500 nm.

2. The method for preparing the AlN based template having the Si substrate according to claim 1, wherein growing an AlN nucleation layer on the Si substrate comprises:
   growing the AlN nucleation layer on the Si substrate using one of a molecular beam epitaxy (MBE) method, a metal-organic chemical vapor deposition (MOCVD) method, a hydride vapor phase epitaxy (HVPE) method or a physical vapor deposition (PVD) method.

3. The method for preparing the AlN based template having the Si substrate according to claim 1, wherein introducing an ion passing through the AlN nucleation layer and into the Si substrate, and introducing another ion into the AlN nucleation layer, respectively comprise:
   introducing the ion passing through the AlN nucleation layer and into the Si substrate using an ion implantation method, and introducing the another ion into the AlN nucleation layer using an ion implantation method.

4. The method for preparing the AlN based template having the Si substrate according to claim 3, wherein a dose of ion for introducing the ion passing through the AlN nucleation layer and into the Si substrate is in a range from $1 \times 10^{10}$ cm$^{-2}$ to $1 \times 10^{16}$ cm$^{-2}$, and an energy of ion for introducing the ion passing through the AlN nucleation layer and into the Si substrate is in a range from 10 KeV to 100 KeV.

5. The method for preparing the AlN based template having the Si substrate according to claim 3, wherein the ion introduced into the Si substrate comprises one or more ions selected from the group consisting of argon (Ar), nitrogen (N), hydrogen (H), oxygen (O), fluorine (F), arsenic (As) and phosphorus (P); and the another ion introduced into the AlN nucleation layer comprises one or more ions selected from the group consisting of Ar, N, iron (Fe), carbon (C), F and magnesium (Mg).

6. A method for preparing a gallium nitride (GaN) based epitaxial structure having a Si substrate, comprising:
   preparing an AlN based template having the Si substrate;
   growing a group III nitride transition layer on an AlN nucleation layer of the AlN based template having the Si substrate;
   growing a GaN buffer layer on the group III nitride transition layer; and
   growing a group III nitride heterostructure for a radio frequency device on the GaN buffer layer;
   wherein preparing an AlN based template having the Si substrate comprises:
      providing the Si substrate;
      growing an AlN nucleation layer on the Si substrate;
      introducing a first ion passing through the AlN nucleation layer and into the Si substrate; and
      introducing a second ion into the AlN nucleation layer, before or after introducing the first iron passing through the AlN nucleation layer and into the Si substrate;
   wherein a resistivity of the Si substrate is in a range from 0.01 $\Omega \cdot cm$ to 10000 $\Omega \cdot cm$, a thickness of the Si substrate is in a range from 100 $\mu m$ to 1500 $\mu m$, and a thickness of the AlN nucleation layer is in a range from 10 nm to 500 nm.

7. The method for preparing the GaN based epitaxial structure having the Si substrate according to claim 6, wherein growing an AlN nucleation layer on the Si substrate comprises:
   growing the AlN nucleation layer on the Si substrate using one of an MBE method, an MOCVD method, an HVPE method, or a PVD method.

8. The method for preparing the GaN based epitaxial structure having the Si substrate according to claim 6, wherein introducing a first ion passing through the AlN nucleation layer and into the Si substrate, and introducing a second ion into the AlN nucleation layer, respectively comprises:
   introducing the first ion passing through the AlN nucleation layer and into the Si substrate using an ion implantation method, and introducing the second ion into the AlN nucleation layer using an ion implantation method.

9. The method for preparing the GaN based epitaxial structure having the Si substrate according to claim 8, wherein a dose of ion for introducing the first ion is in a range from $1 \times 10^{10}$ cm$^{-2}$ to $1 \times 10^{16}$ cm$-2$, an energy of ion for introducing the first ion is in a range from 10 KeV to 100 KeV.

10. The method for preparing the GaN based epitaxial structure having the Si substrate according to claim 8, wherein the first ion introduced into the Si substrate comprises one or more ions selected from the group consisting of Ar, N, H, O, F, As and P; and the second ion introduced into the AlN nucleation layer comprises one or more ions selected from the group consisting of Ar, N, Fe, C, F and Mg.

11. A method for preparing a AlN based template having a Si substrate, comprising:
   step 1, providing the Si substrate;
   step 2, growing an AlN nucleation layer on the Si substrate;
   step 3, introducing a first ion passing through the AlN nucleation layer and into the Si substrate;
   step 4, introducing a second ion into the AlN nucleation layer, before or after the step 3; and
   step 5, changing ion type and ion dose after the step 3 and before the step 4 when the step 4 is after the step 3, or after the step 4 and before the step 3 when the step 4 is before the step 3, so that a type of the first ion is different from that of the second ion and a dose of the first ion is different from that of the second ion.

12. The method for preparing the AlN based template having the Si substrate according to claim 11, wherein the first ion introduced into the Si substrate comprises one or more ions selected from the group consisting of Ar, N, H, F, As and P; and the second ion introduced into the AlN nucleation layer comprises one or more ions selected from the group consisting of Fe, C and Mg.

* * * * *